(12) United States Patent
Yang

(10) Patent No.: US 12,342,567 B2
(45) Date of Patent: Jun. 24, 2025

(54) SEMICONDUCTOR DEVICE AND FABRICATING METHOD THEREOF

(71) Applicant: UNITED MICROELECTRONICS CORP., Hsin-Chu (TW)

(72) Inventor: Po-Yu Yang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 18/631,091

(22) Filed: Apr. 10, 2024

(65) Prior Publication Data
US 2024/0258417 A1 Aug. 1, 2024

Related U.S. Application Data

(63) Continuation of application No. 17/148,526, filed on Jan. 13, 2021, now Pat. No. 11,990,539.

(30) Foreign Application Priority Data

Nov. 19, 2020 (CN) .......................... 202011299296.3

(51) Int. Cl.
| | |
|---|---|
| *H10D 30/47* | (2025.01) |
| *H10D 30/01* | (2025.01) |
| *H10D 62/824* | (2025.01) |
| *H10D 62/85* | (2025.01) |
| *H10D 64/01* | (2025.01) |
| *H10D 64/23* | (2025.01) |

(52) U.S. Cl.
CPC ......... *H10D 30/475* (2025.01); *H10D 30/015* (2025.01); *H10D 62/824* (2025.01); *H10D 62/8503* (2025.01); *H10D 64/01* (2025.01); *H10D 64/258* (2025.01)

(58) Field of Classification Search
CPC ......... H01L 29/66431; H01L 29/66462; H01L 29/778–7789
See application file for complete search history.

(56) References Cited

U.S. PATENT DOCUMENTS

| | | |
|---|---|---|
| 8,486,587 B2 | 7/2013 | Tsai |
| 8,598,628 B2 | 12/2013 | Hikita |
| 9,275,933 B2 | 3/2016 | Kuo |
| 9,553,183 B2 | 1/2017 | Curatola |
| 9,748,139 B1 | 8/2017 | Liou |

(Continued)

FOREIGN PATENT DOCUMENTS

| | | |
|---|---|---|
| CN | 103972284 A | 8/2014 |
| EP | 2 763 179 A2 | 8/2014 |

(Continued)

*Primary Examiner* — Eric A. Ward
(74) *Attorney, Agent, or Firm* — Winston Hsu

(57) ABSTRACT

A semiconductor device includes a substrate, a semiconductor channel layer, a semiconductor barrier layer, a gate capping layer, a dielectric layer, and a gate electrode. The semiconductor channel layer is disposed on the substrate, and the semiconductor barrier layer is disposed on the semiconductor channel layer. The gate capping layer is disposed on the semiconductor barrier layer, and the dielectric layer conformally covers the gate capping layer and surrounds the periphery of the gate capping layer. The gate electrode is disposed on the dielectric layer and covers at least one sidewall of the gate capping layer.

15 Claims, 9 Drawing Sheets

(56) References Cited

U.S. PATENT DOCUMENTS

| | | |
|---|---|---|
| 9,761,791 B2 | 9/2017 | Shiu |
| 10,090,465 B2 | 10/2018 | Hsu |
| 10,985,271 B2 | 4/2021 | Yang |
| 11,081,579 B2 | 8/2021 | Chang |
| 11,239,327 B2 | 2/2022 | Lee |
| 11,264,492 B2 | 3/2022 | Huang |
| 11,296,214 B2 | 4/2022 | Lee |
| 2005/0189559 A1 | 9/2005 | Saito |
| 2009/0146185 A1 | 6/2009 | Suh |
| 2012/0119261 A1 | 5/2012 | Umeda |
| 2013/0113018 A1* | 5/2013 | Wakita ............... H10D 30/475 257/190 |
| 2013/0193485 A1 | 8/2013 | Akiyama |
| 2014/0042449 A1 | 2/2014 | Jeon |
| 2014/0091365 A1 | 4/2014 | Kikkawa |
| 2014/0175451 A1 | 6/2014 | Bhalla |
| 2014/0209922 A1 | 7/2014 | Ota |
| 2016/0141404 A1 | 5/2016 | Tsai |
| 2017/0125565 A1 | 5/2017 | Nishimori |
| 2017/0288046 A1* | 10/2017 | Miyamoto .......... H01L 29/1033 |
| 2018/0090571 A1* | 3/2018 | Okawa ................. H10D 30/64 |
| 2018/0204928 A1 | 7/2018 | Nakata |
| 2018/0294341 A1* | 10/2018 | Chen ................ H01L 29/42376 |
| 2018/0342589 A1* | 11/2018 | Miyamoto .......... H01L 29/2003 |
| 2019/0252509 A1* | 8/2019 | Coppens ............ H01L 29/7786 |
| 2020/0227544 A1 | 7/2020 | Then |
| 2020/0357905 A1 | 11/2020 | Lu |
| 2021/0066483 A1 | 3/2021 | Lin |

FOREIGN PATENT DOCUMENTS

| | | |
|---|---|---|
| EP | 2 763 179 A3 | 10/2015 |
| WO | 2010/064706 A1 | 6/2010 |

\* cited by examiner

SEMICONDUCTOR DEVICE AND FABRICATING METHOD THEREOF

CROSS REFERENCE TO RELATED APPLICATIONS

This application is a continuation application of U.S. Application Ser. No. 17/148,526, filed on Jan. 13, 2021. The content of the application is incorporated herein by reference.

BACKGROUND OF THE INVENTION

1. Field of the Invention

The present invention relates to the field of semiconductor devices, and more particularly to high electron mobility transistors and fabricating method thereof.

2. Description of the Prior Art

In semiconductor technology, group III-V semiconductor compounds may be used to form various integrated circuit (IC) devices, such as high power field-effect transistors (FETs), high frequency transistors, or high electron mobility transistors (HEMTs). A HEMT is a field effect transistor having a two dimensional electron gas (2-DEG) layer close to a junction between two materials with different band gaps (i.e., a heterojunction). The 2-DEG layer is used as the transistor channel instead of a doped region, as is generally the case for metal oxide semiconductor field effect transistors (MOSFETs). Compared with MOSFETs, HEMTs have a number of attractive properties such as high electron mobility and the ability to transmit signals at high frequencies. However, in order to meet the requirements of the industry, there is still a need to improve conventional HEMTs so as to obtain HEMTs with reduced gate current leakage and on-resistance ($R_{ON}$) as well as increased transconductance (gm).

SUMMARY OF THE INVENTION

In view of this, it is necessary to provide an improved high electron mobility transistor so as to meet the requirements of the industry.

According to one embodiment of the present invention, a semiconductor device is disclosed and includes a substrate, a semiconductor channel layer, a semiconductor barrier layer, a gate capping layer, a dielectric layer, and a gate electrode. The semiconductor channel layer is disposed on the substrate, and the semiconductor barrier layer is disposed on the semiconductor channel layer. The gate capping layer is disposed on the semiconductor barrier layer, and the dielectric layer conformally covers the gate capping layer and surrounds the periphery of the gate capping layer. The gate electrode is disposed on the dielectric layer and covers at least one sidewall of the gate capping layer.

According to one embodiment of the present disclosure, a method of fabricating a semiconductor device is disclosed and includes the following steps: providing a substrate; forming a semiconductor channel layer on the substrate; forming a semiconductor barrier layer on the semiconductor channel layer; forming a gate capping layer on the semiconductor barrier layer; forming a dielectric layer conformally covering the gate capping layer and the semiconductor barrier layer; and forming a gate electrode on the dielectric layer, where the gate electrode covers at least one sidewall of the gate capping layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present invention are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
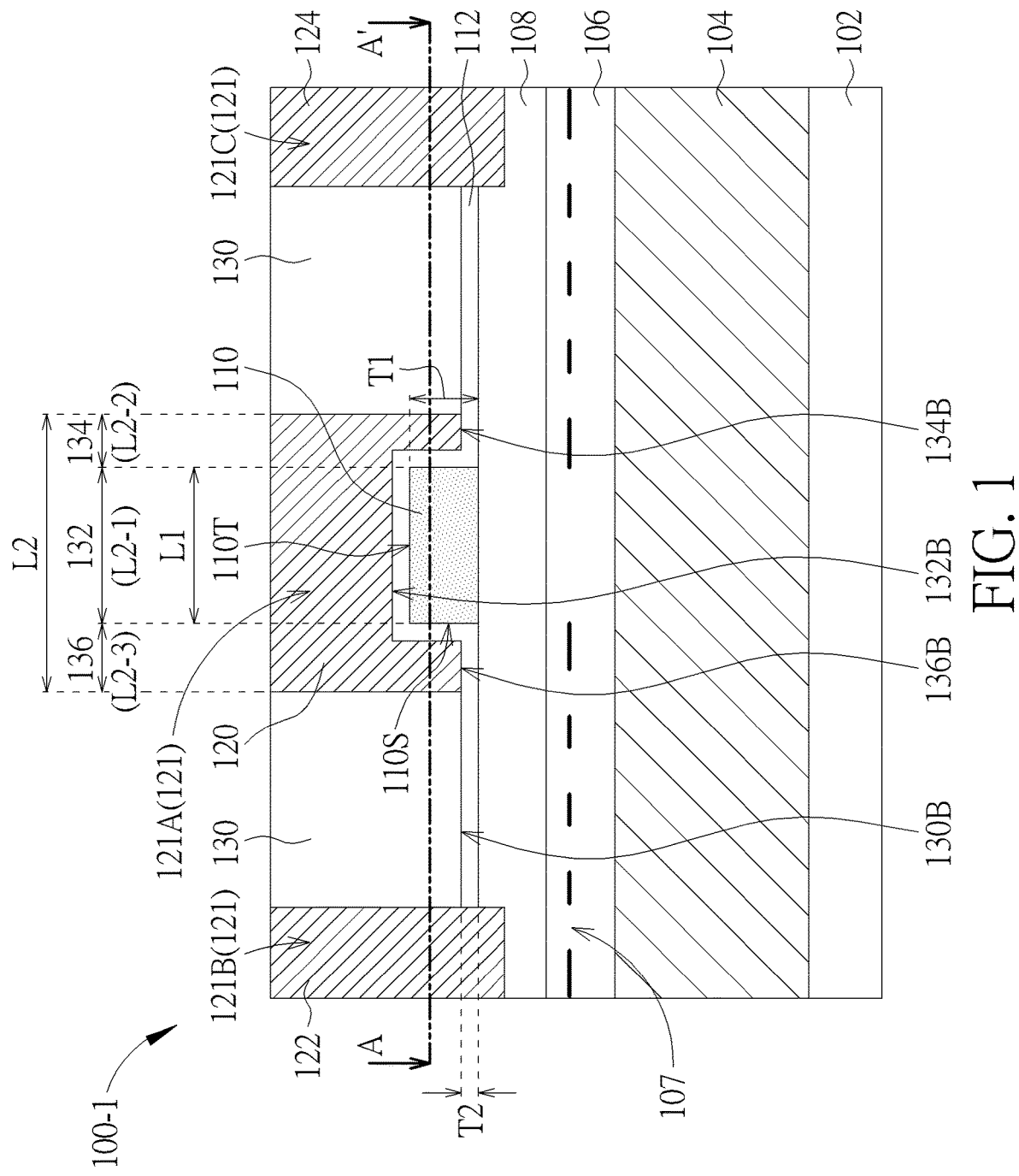
FIG. 1 is a schematic cross-sectional view of a semiconductor device according to one embodiment of the present invention.

The present disclosure may be understood by reference to the following detailed description, taken in conjunction with the drawings as described below. It is noted that, for purposes of illustrative clarity and being easily understood by the readers, various drawings of this disclosure show a portion of the device, and certain elements in various drawings may not be drawn to scale. In addition, the number and dimension of each device shown in drawings are only illustrative and are not intended to limit the scope of the present disclosure.

Certain terms are used throughout the following description to refer to particular components. One of ordinary skill in the art would understand that electronic equipment manufacturers may use different technical terms to describe the same component. The present disclosure does not intend to distinguish between the components that differ only in name but not function. In the following description and claims, the terms "include", "comprise", and "have" are used in an open-ended fashion and thus should be interpreted as the meaning of "include, but not limited to".

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

When an element or layer is referred to as being "coupled to" or "connected to" another element or layer, it may be directly coupled or connected to the other element or layer, or intervening elements or layers may be presented. In contrast, when an element is referred to as being "directly coupled to" or "directly connected to" another element or layer, there are no intervening elements or layers presented.

Further, spatially relative terms, such as "beneath," "below," "lower," "above," "upper" and the like, may be used herein for ease of description to describe one element or feature's relationship to another element (s) or feature (s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means in 10%, 5%, 1%, or 0.5% of a given value or range. Alternatively, the term "about" means in an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that may vary as desired. At the very least, each numerical parameter should at least be construed in light of the number of reported significant digits and by applying ordinary rounding techniques. Ranges may be expressed herein as from one endpoint to another endpoint or between two endpoints. All ranges disclosed herein are inclusive of the endpoints, unless specified otherwise.

It should be noted that the technical features in different embodiments described in the following may be replaced, recombined, or mixed with one another to constitute another embodiment without departing from the spirit of the present invention.

The present invention is directed to a high electron mobility transistor (HEMT) and method for fabricating the same, where HEMTs may be used as power switching transistors for voltage converter applications. Compared to silicon power transistors, group III-V HEMTs feature low on-state resistances and low switching losses due to wide bandgap properties. In the present disclosure, a "group III-V semiconductor" is referred to as a compound semiconductor that includes at least one group III element and at least one group V element, where group III element may be boron (B), aluminum (Al), gallium (Ga) or indium (In), and group V element may be nitrogen (N), phosphorous (P), arsenic (As), or antimony (Sb). Furthermore, the group III-V semiconductor may refer to, but not limited to, gallium nitride (GaN), indium phosphide (InP), aluminum arsenide (AlAs), gallium arsenide (GaAs), aluminum gallium nitride (AlGaN), indium aluminum gallium nitride (InAlGaN), indium gallium nitride (InGaN), and the like, or a combination thereof. In a similar manner, a "III-nitride semiconductor" is referred to as a compound semiconductor that includes nitrogen and at least one group III element, such as, but not limited to, GaN, aluminum nitride (AlN), indium nitride (InN), AlGaN, InGaN, InAlGaN, and the like, or a combination thereof, but is not limited thereto.

FIG. 1 is a schematic cross-sectional view of a semiconductor device according to one embodiment of the present invention. Referring to FIG. 1, a semiconductor device 100-1 includes at least a substrate 102, a semiconductor channel layer 106, a semiconductor barrier layer 108, a gate capping layer 110, a dielectric layer 112, and a gate electrode 120, where the semiconductor channel layer 106 is disposed on the substrate 102. The semiconductor barrier layer 108 is disposed on the semiconductor channel layer 106. The gate capping layer 110 is disposed on the semiconductor barrier layer 108. The dielectric layer 112 covers the gate capping layer 110 and surrounds the periphery of the gate capping layer 110. The gate electrode 120 is disposed on the dielectric layer 112 and covers at least one sidewall 110S of the gate capping layer 110. Furthermore, according to one embodiment of the present invention, an additional buffer layer 104 may be included between the substrate 102 and the semiconductor channel layer 106, which may be used to reduce current leakage between the substrate 102 and the semiconductor channel layer 106, or to reduce stress accumulation or lattice mismatch between the substrate 102 and the semiconductor channel layer 106. According to one embodiment of the present invention, the semiconductor device 100-1 may further include an interlayer dielectric layer 130, a source electrode 122 and a drain electrode 124. The gate electrode 120, the source electrode 122 and the drain electrode 124 may be disposed in the interlayer dielectric layer 130, and the source electrode 122 and the drain electrode 124 may be disposed at two sides of the gate electrode 120, respectively. According to one embodiment of the present invention, a two-dimensional electron gas (2-DEG) region 107 may be generated at the interface of the semiconductor channel layer 106 and the semiconductor barrier layer 108. By providing the gate capping layer 110, the two-dimensional electron gas region 107 may not be generated in the corresponding semiconductor channel layer 106 under the gate capping layer 110, so that a portion of the two-dimensional electron gas region 107 is cut off.

According to one embodiment of the present invention, the substrate 102 may be a bulk silicon substrate, a silicon carbide (Sic) substrate, a sapphire substrate, a silicon on insulator (SOI) substrate, or a germanium on insulator (GOI) substrate, but not limited thereto. The stacked layers on the substrate 102 may be formed by performing any suitable processes, such as molecular-beam epitaxy (MBE), metal organic chemical vapor deposition (MOCVD), hydride vapor phase epitaxy (HVPE), atomic layer deposition (ALD), or other suitable methods, to thereby form the buffer layer 104, the semiconductor channel layer 106, the semiconductor barrier layer 108, and the gate capping layer 110 disposed on the substrate 102.

The buffer layer 104 may include a plurality of sub-semiconductor layers (i.e., multiple layers) and the overall resistance of the buffer layer 104 may be higher than the resistance of other layers on the substrate 102. Specifically, the ratio of some elements, such as metal element, of the buffer layer 104 may be changed gradually along a direction from the substrate 102 to the semiconductor channel layer 106. For example, for a case where the substrate 102 and the semiconductor channel layer 106 are a silicon substrate and a GaN layer, respectively, the buffer layer 104 may be graded aluminum gallium nitride ($Al_xGa_{(1-x)}N$) where there is a continuous or stepwise decrease in the x ratio from 0.9 to 0.15 along the direction from the substrate 102 to the semiconductor channel layer 106. In another case, the buffer layer 104 may have a superlattice structure.

The semiconductor channel layer 106 may include one or more layers of group III-V semiconductor composed of GaN, AlGaN, InGaN, or InAlGaN, but not limited thereto. In addition, the semiconductor channel layer 106 may also be one or more layers of doped group III-V semiconductor, such as p-type III-V semiconductor. For the p-type group III-V semiconductor, the dopants of which may be C, Fe, Mg or Zn, but not limited thereto.

The semiconductor barrier layer 108 may include one or more layers of group III-V semiconductor with the composition different from that of the group III-V semiconductor of the semiconductor channel layer 106. For example, the semiconductor barrier layer 108 may include AlN, $Al_yGa_{(1-y)}N$ (0<y<1), or a combination thereof. In accordance with one embodiment, the semiconductor channel layer 106 may be an undoped GaN layer, and the semiconductor barrier layer 108 may be an inherent n-type AlGaN layer. Since there is a bandgap discontinuity between the semiconductor channel layer 106 and the semiconductor barrier layer 108, by stacking the semiconductor channel layer 106 and the semiconductor barrier layer 108 on each other (and vice versa), a thin layer with high electron mobility, also called a two-dimensional electron gas, may be accumulated near the heterojunction between the semiconductor channel layer 106 and the semiconductor barrier layer 108 due to the piezoelectric effect.

The gate capping layer 110 may include one or more layers of group III-V semiconductor with the composition different from that of the group III-V semiconductor of the semiconductor barrier layer 108, such as p-type III-V semiconductor. For the p-type group III-V semiconductor, the dopants of which may be C, Fe, Mg or Zn, but not limited thereto. According to one embodiment of the present invention, the gate capping layer 110 may be a p-type GaN layer.

According to one embodiment of the present invention, the dielectric layer 112 may conformally cover the gate capping layer 110. The dielectric layer 112 may cover not only the top surface 110T and the sidewalls 110S of the gate capping layer 110, but also the top surface of the semiconductor barrier layer 108, but not limited thereto. The composition of the dielectric layer 112 may include a dielectric material, such as a high dielectric constant (high-k) material with a dielectric constant greater than 4. The material of the high-k dielectric may be selected from the group consisting of hafnium oxide (HfO), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST), or a combination thereof.

A thickness T2 of the dielectric layer 112 may be thinner than a thickness T1 of the gate capping layer 110. According to one embodiment of the present invention, a blanket deposition process may be used to fabricate the dielectric layer 112 covering the surfaces of the gate capping layer 110 and the semiconductor barrier layer 108.

According to one embodiment of the present invention, the interlayer dielectric layer 130 is disposed on the dielectric layer 112, and the bottom surface of the interlayer dielectric layer 130 may be lower than the top surface 110T of the gate capping layer 110, while the top surface of the interlayer dielectric layer 130 may be higher than the top surface 110T of the gate capping layer 110. By disposing the dielectric layer 130, the dielectric layer 112 may thus be arranged between the interlayer dielectric layer 130 and the sidewall 110S of the gate capping layer 110 or arranged between the interlayer dielectric layer 130 and the semiconductor barrier layer 108. According to one embodiment of the present invention, a gate contact hole may be formed in the interlayer dielectric layer 130 by etching through the interlayer dielectric layer 130 through one or more etching processes. The dielectric layer 112 may be further etched through to thereby form a source contact hole and a drain contact hole respectively disposed at two sides of the gate contact hole in the interlayer dielectric layer 130. The gate contact hole may expose the dielectric layer 112 on the sidewall 110S of the gate capping layer 110, and the gate contact hole may be used to accommodate the gate electrode 120. The source contact hole and the drain contact hole may expose the semiconductor barrier layer 108 or the semiconductor channel layer 106, and may be used to accommodate the source electrode 122 and the drain electrode 124, respectively.

According to one embodiment of the present invention, the gate electrode 120 is disposed on the gate capping layer 110 such that the dielectric layer 112 is sandwiched between the gate electrode 120 and the gate capping layer 110. The length L2 of the gate electrode 120 may be greater than the length L1 of the gate capping layer 110. Since the dielectric layer 112 is disposed between the gate electrode 120 and the gate capping layer 110, the gate electrode 120, the dielectric layer 112, and the gate capping layer 110 may constitute a capacitor structure, so that current leakage between the gate electrode 120 and the gate capping layer 110 may be avoided. Further, the gate electrode 120 may include a body portion 132 and at least one extension portion, such as a first extension portion 134 and a second extension portion 136, disposed at least one side of the body portion 132. The body portion 132 may have a length L2-1 and be disposed right above the gate capping layer 110, and the first extension portion 134 and the second extension portion 136 may be disposed at two sides of the body portion 132, respectively. The first extending portion 134 and the second extending portion 136 may have the same or different lengths L2-2, L2-3. According to one embodiment of the present invention, the bottom surface of a portion of the gate electrode 120 (e.g., the body portion 132) may be higher than the top surface 110T of the gate capping layer 110, while the bottom surfaces of other parts of the gate electrode 120 (e.g., the first extension portion 134 and the second extension portion 136) may be lower than the top surface 110T of the gate capping layer 110, so that the bottom surface 132B of the body portion 132 may be higher than the bottom surface 134B of the first extension portion 134 as well as the bottom surface 136B of the second extension portion 136.

According to one embodiment of the present invention, the source electrode 122 and the drain electrode 124 are electrically connected to the semiconductor layer 108 and the semiconductor channel layer 106. According to one embodiment of the present invention, when operating the semiconductor device 100-1, the source electrode 122 may be electrically connected to a relatively low external voltage (e.g., 0V), and the drain electrode 124 may be electrically connected to a relatively high external voltage (e.g., 200V), but not limited thereto. By applying appropriate bias to the source electrode 122 and the drain electrode 124, current may flow into or out of the semiconductor device 100-1. In addition, by applying an appropriate bias to the gate electrode 120, the degree of conductivity of the channel region may be adjusted, so that current may flow between the source electrode 122 and the drain electrode 124. The gate electrode 120, the source electrode 122, and the drain electrode 124 may each be a single-layer or multi-layer structure, and their compositions may include low-resistance semiconductor, metal, or alloy, such as Al, Cu, W, Au, Pt, Ti, polysilicon and so forth, but not limited thereto. In addition, the source electrode 122 and the drain electrode 124 may each constitute ohmic contact with the underlying semiconductor channel layer 106.

Figure 2:
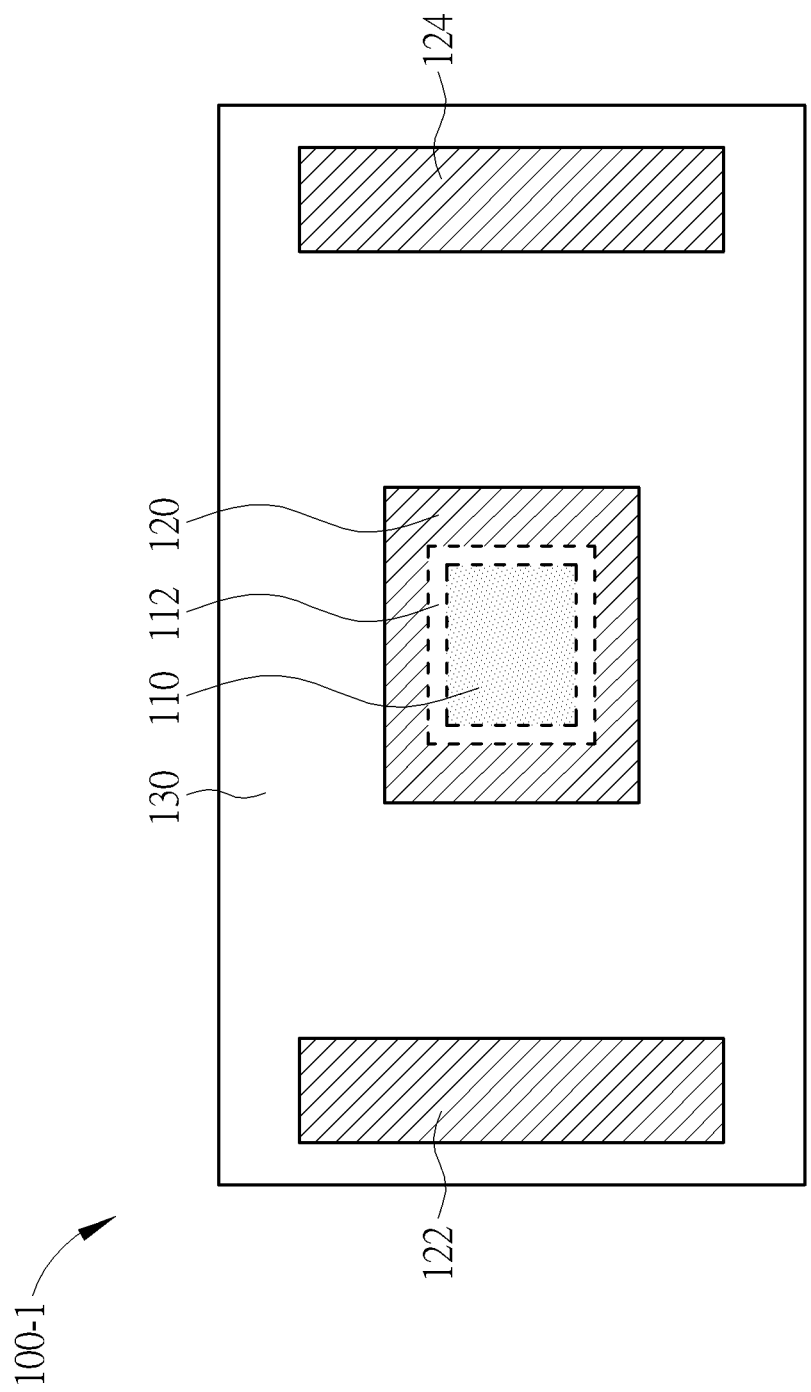
FIG. 2 is a schematic top view of a semiconductor device taken along a line A-A' of FIG. 1 according to one embodiment of the present invention.

FIG. 2 is a schematic top view of a semiconductor device taken along a line A-A' in FIG. 1 according to one embodiment of the present invention. Referring to FIG. 2, the periphery of the gate capping layer 110 of the semiconductor device 100-1 may be surrounded by a dielectric layer 112, and the periphery of the dielectric layer 112 may be further surrounded by a gate electrode 120.

In addition to the above embodiments, the present invention may further include other modifications about semiconductor devices. For the sake of simplicity, the description below is mainly focused on differences among these embodiments. In addition, the present invention may repeat reference numerals and/or letters in the various modifications and variations. This repetition is for the purpose of simplicity and clarity and does not in itself dictate a relationship between the various embodiments and/or configurations discussed.

Figure 3:
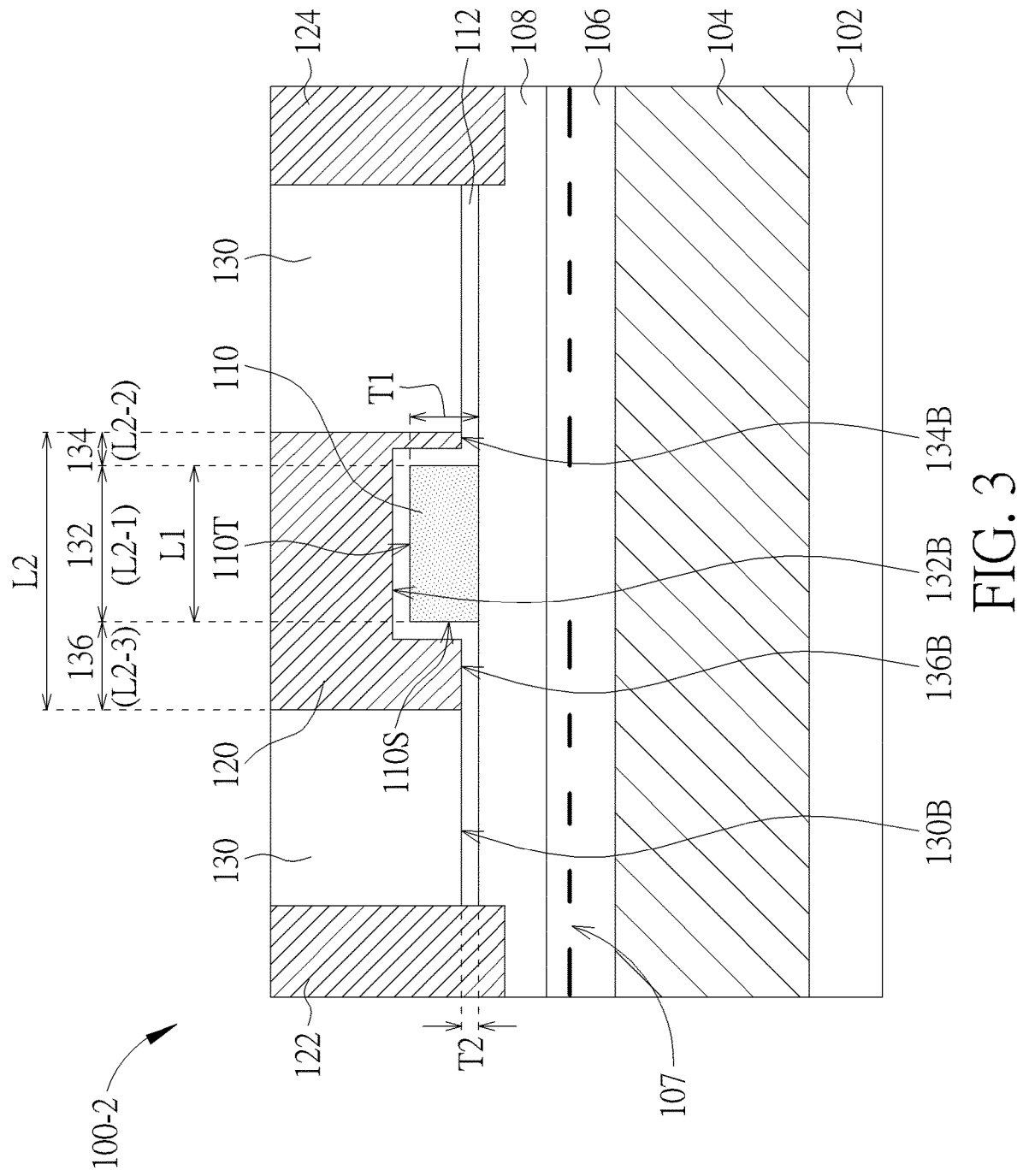
FIG. 3 is a schematic cross-sectional view of a semiconductor device according to a variant embodiment of the present invention.

FIG. 3 is a schematic cross-sectional view of a semiconductor device according to a variant embodiment of the present invention. Referring to FIG. 3, the structure of the semiconductor device 100-2 is similar to that of the semiconductor device 100-1 shown in the embodiment of FIG. 1. The main difference is that the length L2-2 of the first extension portion 134 in the semiconductor device 100-2 is smaller than the length L2-3 of the second extension portion 136. Therefore, the first extension portion 134 and the second extension portion 136 may each has different capability to control the distribution of the electric field in the underlying semiconductor barrier layer 108 and the semiconductor channel layer 106.

Figure 4:
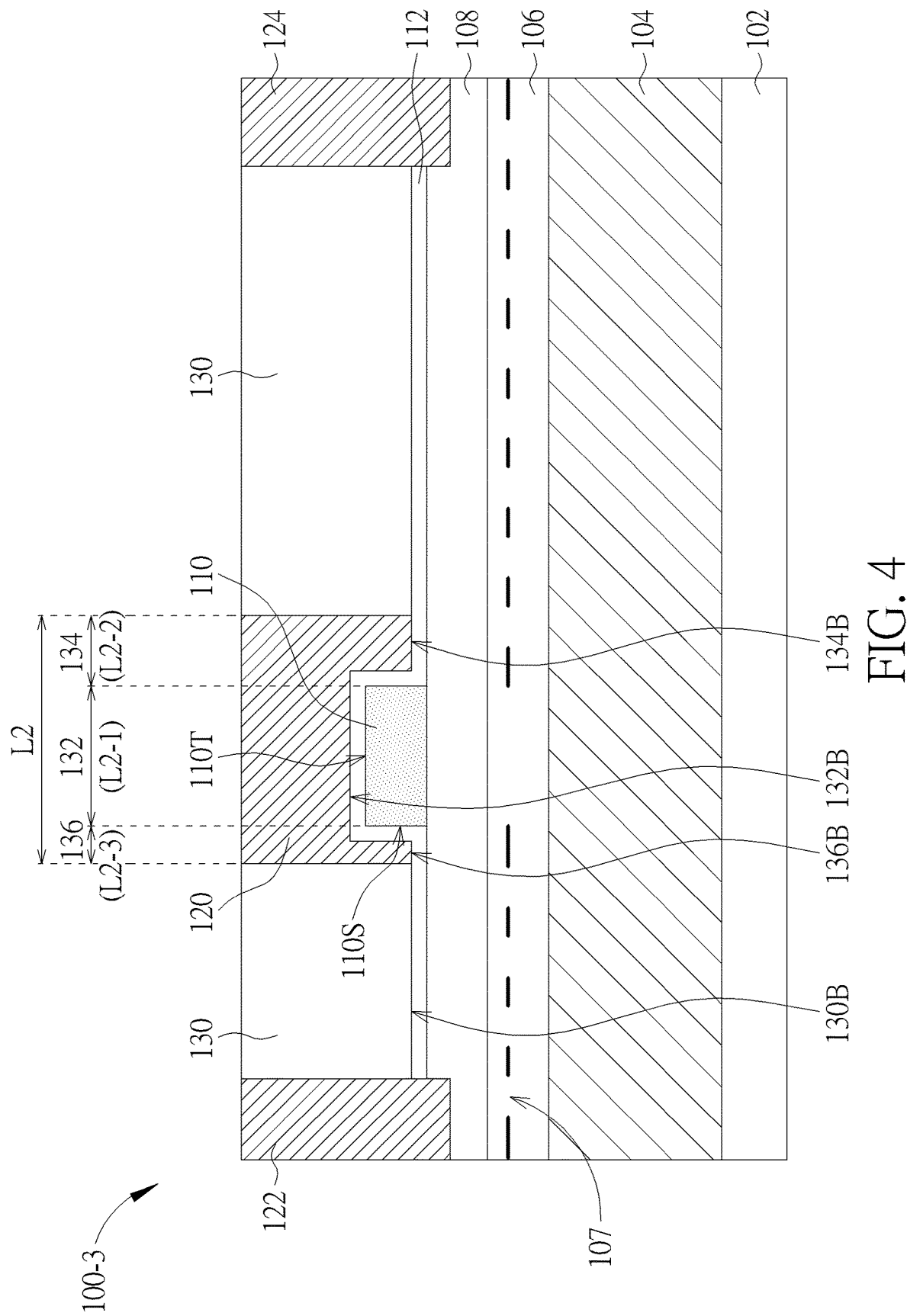
FIG. 4 is a schematic cross-sectional view of a semiconductor device according to a variant embodiment of the present invention.

FIG. 4 is a schematic cross-sectional view of a semiconductor device according to a variant embodiment of the present invention. Referring to FIG. 4, the structure of the semiconductor device 100-3 is similar to that of the semiconductor device 100-1 shown in the embodiment of FIG. 1, in which the distance between the drain electrode 124 and the gate electrode 120 in the semiconductor device 100-3 is greater than the distance between the source electrode 122 and the gate electrode 120. Since the drain electrode 124 is electrically connected to a relatively high external voltage compared with the voltage applied to the source electrode 122, when the length L2-2 of the first extension portion 134 in the semiconductor device 100-2 is greater than the length L2-3 of the second extension portion 136, the phenomenon of electric field crowding in the semiconductor barrier layer 108 and the semiconductor channel layer 106 under the first extension portion 134 may be reduced more effectively.

Figure 5:
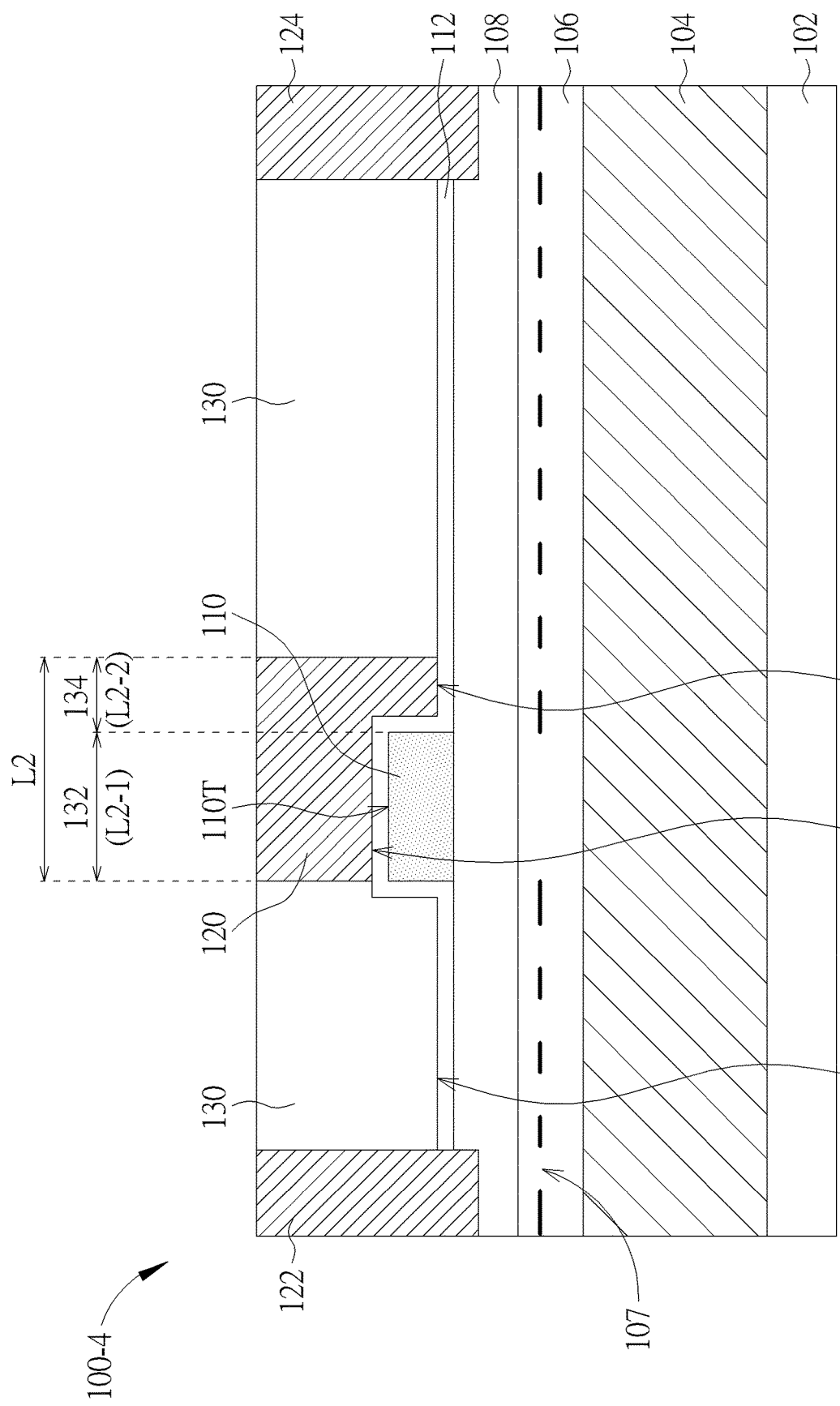
FIG. 5 is a schematic cross-sectional view of a semiconductor device according to a variant embodiment of the present invention.

FIG. 5 is a schematic cross-sectional view of a semiconductor device according to a variant embodiment of the present invention. Referring to FIG. 5, the structure of the semiconductor device 100-4 is similar to that of the semiconductor device 100-3 shown in the embodiment of FIG. 4, in which the dielectric layer 112 or the gate capping layer 110 in the semiconductor device 100-4 may protrude from one side of the gate electrode 120. Therefore, the electrode extension portion of the gate electrode 120 includes only the first extension portion 134 but without the second extension portion. In a case where the source electrode 122 is electrically connected to a relatively low external voltage, since there is only slight electric field crowding generating in the semiconductor barrier layer 108 and the semiconductor channel layer 106 between the source electrode 122 and the gate electrode 120, it is unnecessary to provide the electrode extension portions between the source electrode 122 and the gate electrode 120.

Figure 6:
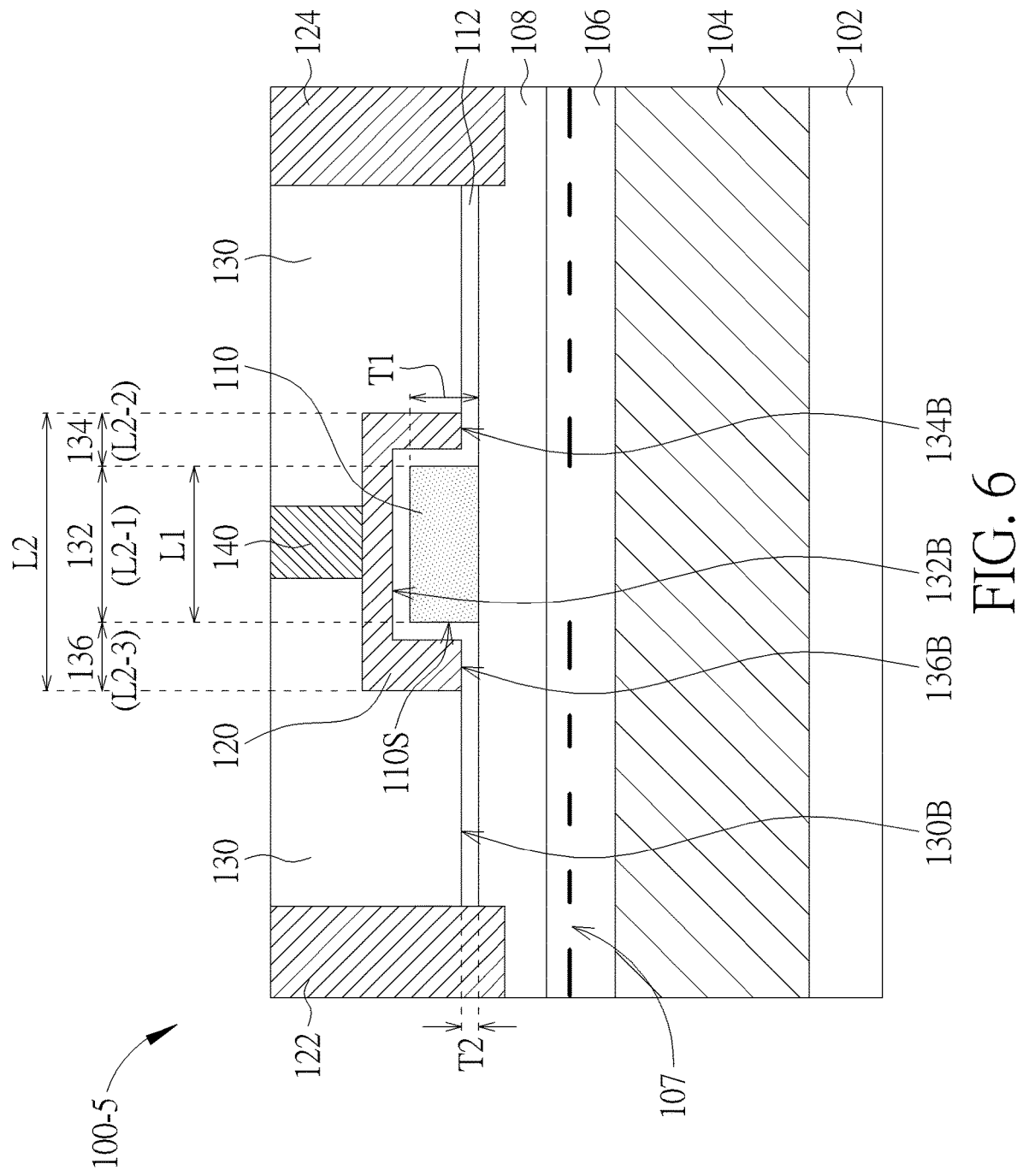
FIG. 6 is a schematic cross-sectional view of a semiconductor device according to a variant embodiment of the present invention.

FIG. 6 is a schematic cross-sectional view of a semiconductor device according to a variant embodiment of the present invention. Referring to FIG. 6, the structure of the semiconductor device 100-5 is similar to that of the semiconductor device 100-1 shown in the embodiment of FIG. 1. The main difference is that the gate electrode 120 in the semiconductor device 100-5 may conformally cover the underlying dielectric layer 112, so the entire gate electrode 120 may be covered with the interlayer dielectric layer 130. A conductive plug 140 may be disposed in the interlayer dielectric layer 130 so that the conductive plug 140 may be electrically connected to the gate electrode 120.

Figure 7:
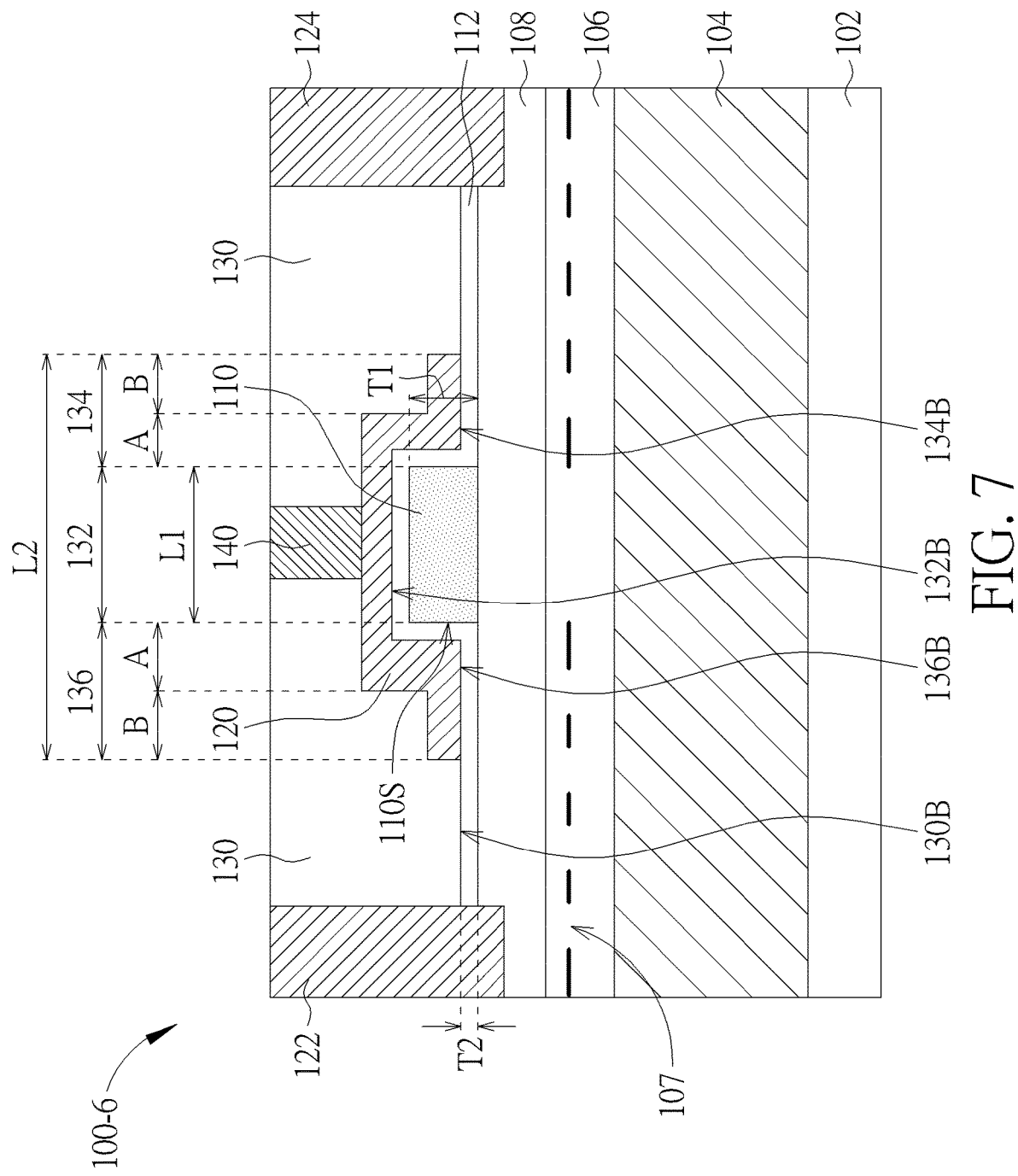
FIG. 7 is a schematic cross-sectional view of a semiconductor device according to a variant embodiment of the present invention.

FIG. 7 is a schematic cross-sectional view of a semiconductor device according to a variant embodiment of the present invention. Referring to FIG. 7, the structure of the semiconductor device 100-6 is similar to that of the semiconductor device 100-5 shown in the embodiment of FIG. 6. The main difference is that the first extension portion 134 and the second extension portion 136 of the gate electrode 120 in the semiconductor device 100-6 may each include a vertical extension portion A and a horizontal extension portion B, and the vertical extension portion A and the horizontal extension portion B may conformally cover the underlying dielectric layer 112. The horizontal extension portion B may extend from a lower sidewall of the vertical extension portion A and extend away from the gate capping layer 110, for example, toward the drain electrode 124 or the source electrode 122. The top surface of the horizontal extension portion B may be lower than the top surface of the vertical extension portion A. The horizontal extension portion B may cover the semiconductor barrier layer 108 and the dielectric layer 112 and conformally cover the dielectric layer 112.

According to embodiments of the present invention, the method of fabricating the above semiconductor devices 100-1, 100-2, 100-3, 100-4, 100-5, 100-6 may include at least the following steps: providing a substrate 102; forming a semiconductor channel layer 106 on the substrate 102; forming a semiconductor barrier layer 108 on the semiconductor channel layer 106; forming a gate capping layer 110 on the semiconductor barrier layer 108; forming a dielectric layer 112 conformally covering the gate capping layer 110 and the semiconductor barrier layer 108; and forming a gate electrode 120 on the dielectric layer 112, where the gate electrode 120 covers at least one sidewall 110S of the gate capping layer 110.

The electrical characteristic of the semiconductor device according to the embodiments of the present invention are further disclosed as follows. For the semiconductor devices 100-1, 100-2, 100-3, 100-4, 100-5, 100-6 disclosed above, since the dielectric layer 112 is arranged between the gate electrode 120 and the gate capping layer 110, the gate current leakage may be reduced effectively. In addition, since the dielectric layer 112 is disposed between the first extension portion 134 or the second extension portion 136 of the gate electrode 120 and the underlying semiconductor barrier layer 108, but the gate capping layer 110 is not disposed between the first extension portion 134 or the second extension portion 136 and the semiconductor barrier layer 108, the first extension portion 134 or the second extension portion 136 may each be regarded as a field plate for controlling or adjusting the distribution of the electric field in the semiconductor barrier layer 108 and the semiconductor channel layer 106. By providing the first extension portion 134 or the second extension portion 136, not only the on-resistance ($R_{ON}$) of the semiconductor devices 100-1, 100-2, 100-3, 100-4, 100-5, 100-6 may be reduced, but also the transconductance (gm) of the devices may be improved, thus improving the electrical performance of the semiconductor devices 100-1, 100-2, 100-3, 100-4, 100-5, 100-6.

Figure 8:
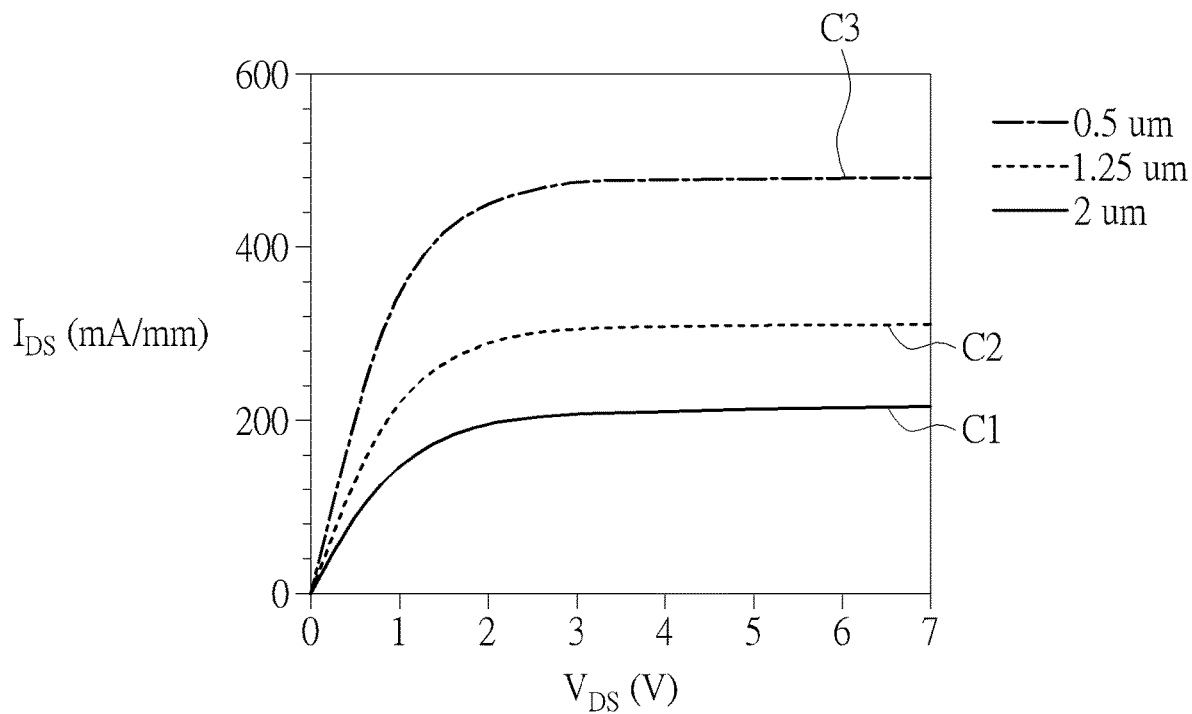
FIG. 8 is a diagram showing electrical characteristics (IDS-VDS) of a semiconductor device according to one embodiment of the present invention.

FIG. 8 is a diagram showing an electrical characteristic of $I_{DS}$-$V_{DS}$ of a semiconductor device according to one embodiment of the present invention. According to one embodiment of the present invention, the lengths of the gate electrode 120 and the gate capping layer 110 in the semiconductor device 100-1 shown in FIG. 1 may be adjusted, and the corresponding $I_{DS}$-$V_{DS}$ electrical characteristic may be measured. Referring to FIG. 8, for a fixed-length gate electrode 120, such as 2 μm, the length of the gate capping layer 110 is set to be 2 μm, 1.25 μm and 0.5 μm, respectively, and the corresponding $I_{DS}$-$V_{DS}$ curves may correspond to curves C1, C2, C3. Referring to FIG. 8, for a case where the gate electrode 120 covers the top surface and sidewalls of the gate capping layer 110 (corresponding to curves C2, C3), its on-resistance may be smaller than the on-resistance of the device where the gate electrode 120 does not cover the sidewalls of the gate capping layer 110 (corresponding to curve C1), thus showing a larger $I_{DS}$ at the same $V_{DS}$s. In addition, when the electrode extension portion of the gate capping layer 110 is further increased (corresponding to curve C3), the on-resistance of the corresponding semiconductor device 100-1 becomes smaller than the on-resistance of the semiconductor device 100-1 with a shorter electrode extension portion (corresponding to curve C2), thus having a larger $I_{DS}$ at the same $V_{DS}$.

Figure 9:
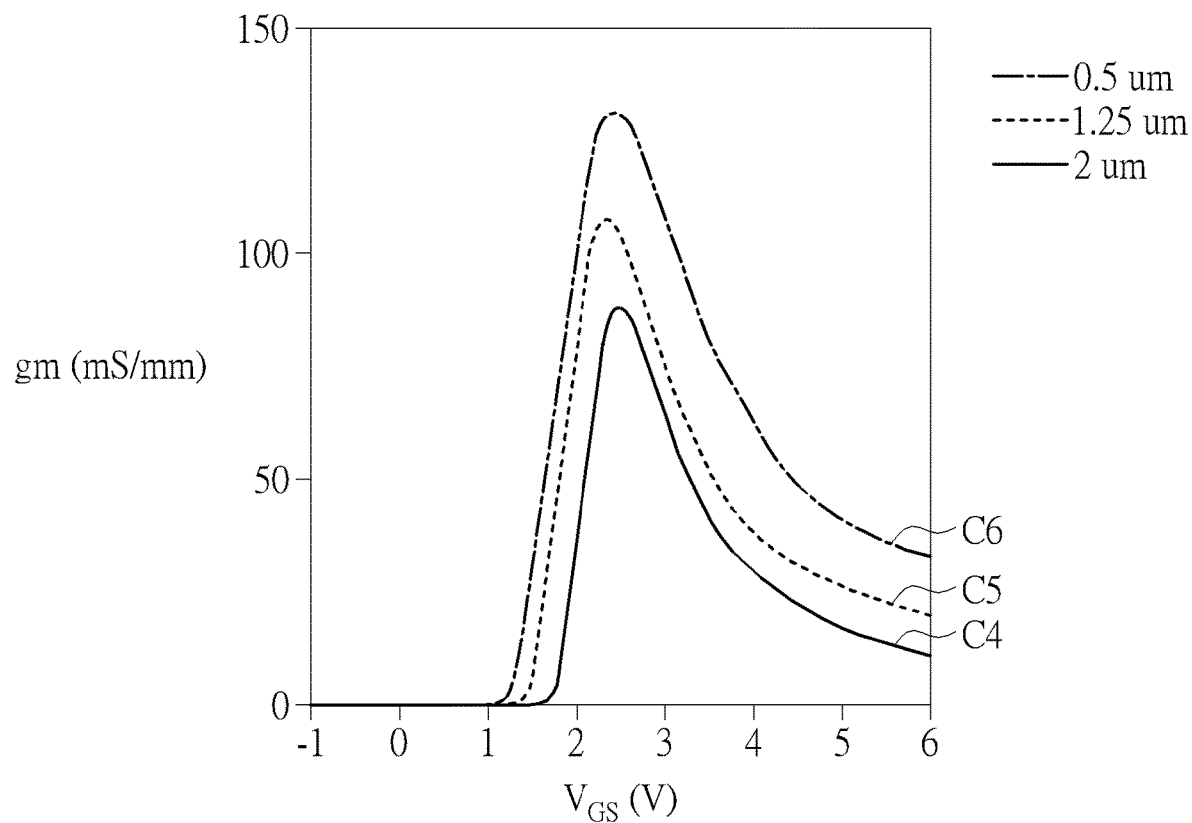
FIG. 9 is a diagram showing electrical characteristics (gm) of a semiconductor device according to one embodiment of the present invention.

FIG. 9 is an electrical characteristic of the transconductance (gm) of a semiconductor device according to one embodiment of the present invention. According to one embodiment of the present invention, the lengths of the gate electrode 120 and the gate capping layer 110 in the semiconductor device 100-1 shown in FIG. 1 may be adjusted, and the corresponding transconductance performance may be measured. Referring to FIG. 9, for a fixed-length gate electrode 120, such as 2 μm, the length of the gate capping layer 110 is set to be 2 μm, 1.25 μm and 0.5 μm, and the corresponding transconductance curves are a curve C4, a curve C5 and a curve C6. Referring to FIG. 9, in a case where the gate electrode 120 covers the top surface and sidewall of the gate capping layer 110 (corresponding to curve C5 and curve C6), the transconductance will be larger than that of the device where the gate electrode 120 does not cover the sidewall of the gate capping layer 110 (corresponding to curve C4), which enables the carrier channel of the semiconductor device 100-1 to be turned on or off more easily. In addition, in a case where the electrode extension of the gate capping layer 110 is increased (corresponding to curve C6), the transconductance of the semiconductor device 100-1 may be larger than that of the semiconductor device 100-1 with a shorter electrode extension (corresponding to curve C5), so that the carrier channel of the semiconductor device 100-1 may be turned on or off more easily.

Figure 10:
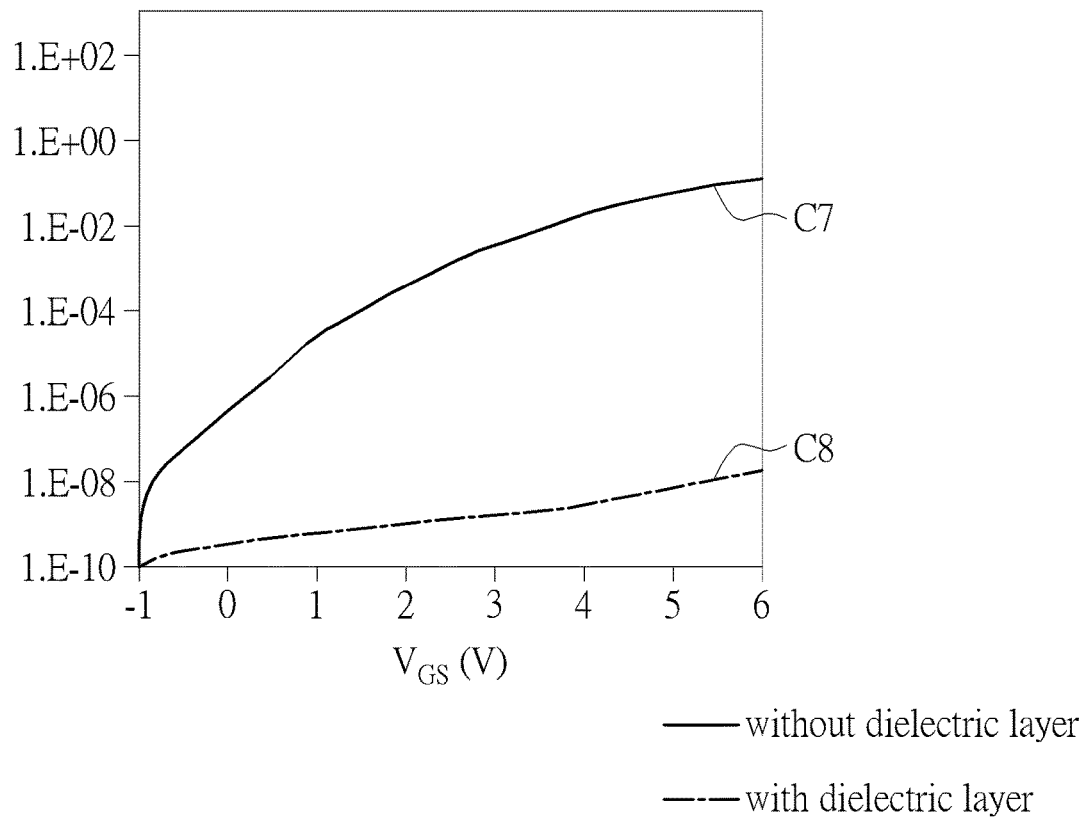
FIG. 10 is a diagram showing electrical characteristics (gate current leakage) of a semiconductor device according to one embodiment of the present invention.

FIG. 10 is a diagram showing an electrical characteristic regarding a gate current leakage of a semiconductor device according to one embodiment of the present invention. Referring to FIG. 10, according to one embodiment of the present invention, for the semiconductor device 100-1 shown in FIG. 1, when the dielectric layer 112 is arranged in the semiconductor device 100-1 (corresponding to curve C8), its gate current leakage is smaller than that of the semiconductor device without the dielectric layer 112 (corresponding to curve C7), so that the electrical performance of the semiconductor device 100-1 is improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
    a substrate;
    a semiconductor channel layer disposed on the substrate;
    a semiconductor barrier layer disposed on the semiconductor channel layer;
    a gate capping layer disposed on the semiconductor barrier layer, wherein the gate capping layer comprises a top surface, a first sidewall, and a second sidewall opposite to the first sidewall;
    a dielectric layer conformally covering the gate capping layer and surrounding a periphery of the gate capping layer, wherein the top surface of the gate capping layer is completely covered with the dielectric layer in a top view;
    a gate electrode disposed on the dielectric layer, completely covering the dielectric layer on the top surface of the gate capping layer, wherein the gate electrode is completely separated from the gate capping layer by the dielectric layer, and a top surface of the gate capping layer contacts the dielectric layer, wherein the top surface of the gate capping layer is completely covered with the gate electrode in a top view;
    an interlayer dielectric layer disposed on the semiconductor barrier layer, wherein a bottom surface of the interlayer dielectric layer is lower than a top surface of the gate capping layer, and the dielectric layer is disposed between the interlayer dielectric layer and the semiconductor barrier layer; and a source electrode and a drain electrode respectively disposed in a source contact hole and a drain contact hole, wherein the source contact hole and the drain contact hole are disposed in the semiconductor barrier layer, and bottom surfaces of the source contact hole and the drain contact hole are disposed between a top surface and a bottom surface of the semiconductor barrier layer so as to expose the semiconductor barrier layer.

2. The semiconductor device according to claim 1, wherein a thickness of the dielectric layer is less than a thickness of the gate capping layer.

3. The semiconductor device according to claim 1, wherein the dielectric layer is disposed between the gate capping layer and the gate electrode.

4. The semiconductor device according to claim 1, wherein the dielectric layer conformally covers a top surface of the semiconductor barrier layer.

5. The semiconductor device according to claim 1, wherein the dielectric layer is a high-k dielectric layer.

6. The semiconductor device according to claim 1, wherein a portion of a bottom surface of the gate electrode is lower than the top surface of the gate capping layer.

7. The semiconductor device according to claim 1, wherein the gate electrode conformally covers the dielectric layer.

8. The semiconductor device according to claim 1, wherein a length of the gate electrode is greater than a length of the gate capping layer.

9. The semiconductor device according to claim 1, wherein a portion of the gate capping layer protrudes from one side of the gate electrode.

10. The semiconductor device according to claim 1, wherein the gate electrode comprises a body portion and at least one extension portion, the at least one extension portion being disposed at one side of the body portion and a bottom surface of the at least one extension portion being lower than a bottom surface of the body portion.

11. The semiconductor device according to claim 1, wherein the dielectric layer is disposed between the interlayer dielectric layer and the sidewall of the gate capping layer.

12. A method of fabricating a semiconductor device, comprising:
providing a substrate;
forming a semiconductor channel layer on the substrate;
forming a semiconductor barrier layer on the semiconductor channel layer;
forming a gate capping layer on the semiconductor barrier layer, wherein the gate capping layer comprises a top surface, a first sidewall, and a second sidewall opposite to the first sidewall;
forming a dielectric layer conformally covering the gate capping layer and the semiconductor barrier layer, wherein the top surface of the gate capping layer is completely covered with the dielectric layer in a top view;
forming a gate electrode on the dielectric layer, wherein the gate electrode completely covers the dielectric layer on the top surface of the gate capping layer, and the gate electrode is completely separated from the gate capping layer by the dielectric layer, wherein a top surface of the gate capping layer contacts the dielectric layer, wherein the top surface of the gate capping layer is completely covered with the gate electrode in a top view;
forming an interlayer dielectric layer covering the dielectric layer before forming the gate electrode, wherein a top surface of the interlayer dielectric layer is higher than the top surface of the gate capping layer; and
forming a source contact hole and a drain contact hole and disposing therein a source electrode and a drain electrode, respectively, wherein the source contact hole and the drain contact hole are formed into the semiconductor barrier layer, and bottom surfaces of the source contact hole and the drain contact hole are disposed between a top surface and a bottom surface of the semiconductor barrier layer so as to expose the semiconductor barrier layer.

13. The method of fabricating the semiconductor device according to claim 12, before forming the gate electrode, further comprising forming a contact hole in the interlayer dielectric layer so as to expose the dielectric layer on the sidewall of the gate capping layer.

14. The method of fabricating the semiconductor device according to claim 12, after forming the interlayer dielectric layer, further comprising etching through the interlayer dielectric layer and the dielectric layer to form a through hole and expose the semiconductor barrier layer.

15. The method of fabricating the semiconductor device according to claim 12, wherein the gate electrode conformally covers the dielectric layer.

* * * * *